(12) United States Patent
Ni

(10) Patent No.: US 10,461,490 B2
(45) Date of Patent: Oct. 29, 2019

(54) RADIATION SOURCE

(71) Applicant: ASML Netherlands B.V., Veldhoven (NL)

(72) Inventor: Yongfeng Ni, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/143,018

(22) Filed: Sep. 26, 2018

(65) Prior Publication Data

US 2019/0103721 A1 Apr. 4, 2019

(30) Foreign Application Priority Data

Sep. 29, 2017 (EP) .................................... 17194047

(51) Int. Cl.
*H01S 3/067* (2006.01)
*G02F 1/365* (2006.01)
(Continued)

(52) U.S. Cl.
CPC .......... *H01S 3/06741* (2013.01); *G02F 1/365* (2013.01); *G03F 7/70616* (2013.01);
(Continued)

(58) Field of Classification Search
None
See application file for complete search history.

(56) References Cited

U.S. PATENT DOCUMENTS 6,952,253 B2 \* 10/2005 Lof ..................... G03F 7/70341
355/30
6,961,116 B2 11/2005 Den Boef et al.
(Continued)

FOREIGN PATENT DOCUMENTS

CN 103296569 A 9/2013
CN 105762649 A 7/2016
(Continued)

OTHER PUBLICATIONS

International Search Report directed to related International Patent Application No. PCT/EP2018/072285, dated Jan. 4, 2019; 4 pages.

*Primary Examiner* — Rhonda S Peace
(74) *Attorney, Agent, or Firm* — Sterne, Kessler, Goldstein & Fox P.L.L.C.

(57) ABSTRACT

A supercontinuum radiation source comprises: a radiation source, an optical amplifier and a non-linear optical medium. The radiation source is operable to produce a pulsed radiation beam. The optical amplifier is configured to receive the pulsed radiation beam and increase an intensity of the pulsed radiation beam. The non-linear optical medium is configured to receive the amplified pulsed radiation beam and to broaden its spectrum so as to generate a supercontinuum radiation beam. The optical amplifier may supply a pump radiation beam to a gain medium, an intensity of the pump radiation beam being periodic and having a pump frequency that is an integer multiple of the frequency of the pulsed radiation beam. The optical amplifier may supply pump energy to a gain medium only when the pulses of the pulsed radiation beam propagate through the gain medium.

12 Claims, 8 Drawing Sheets

(51) Int. Cl.
  *H01S 3/094*  (2006.01)
  *H01S 3/10*  (2006.01)
  *G03F 7/20*  (2006.01)
  *G03F 9/00*  (2006.01)
  *G02F 1/35*  (2006.01)

(52) U.S. Cl.
  CPC ........ *G03F 9/7065* (2013.01); *H01S 3/06754* (2013.01); *H01S 3/094003* (2013.01); *H01S 3/10007* (2013.01); *G02F 2001/3528* (2013.01); *G02F 2202/32* (2013.01)

(56) References Cited

U.S. PATENT DOCUMENTS

| | | | |
|---|---|---|---|
| 7,283,236 B2 * | 10/2007 | Presura | G03F 9/7076 257/797 |
| 8,385,699 B2 | 2/2013 | Liu | |
| 9,354,485 B2 * | 5/2016 | Fermann | G02F 1/39 |
| 9,871,336 B2 | 1/2018 | Dvoyrin et al. | |
| 2009/0195768 A1 | 8/2009 | Bijnen et al. | |
| 2011/0085726 A1 | 4/2011 | Den Boef et al. | |
| 2015/0261097 A1 | 9/2015 | Mathijssen et al. | |
| 2017/0352999 A1 | 12/2017 | Cormier et al. | |
| 2019/0103721 A1 * | 4/2019 | Ni | G02F 1/365 |

FOREIGN PATENT DOCUMENTS

| EP | 1 801 643 A1 | 6/2007 |
|---|---|---|
| WO | WO 2017/062181 A1 | 4/2017 |

\* cited by examiner

RADIATION SOURCE

FIELD

The present invention relates to a radiation source. In particular, it relates to a radiation source that may form part of a metrology system. The radiation source may, for example, form part of an alignment system, or other position measurement system, within a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law', To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In order to control the lithographic process to place device features accurately on the substrate, marks may be provided on the substrate, and the lithographic apparatus may include one or more alignment sensors by which positions of such marks on a substrate can be measured accurately. These alignment sensors are effectively position measuring apparatuses. Different types of alignment marks and different types of alignment sensors are known e.g. are provided by different manufacturers. In general, an alignment sensor has a radiation source which provides a beam of radiation of one or more wavelengths which is projected onto a mark located on a substrate. Radiation diffracted by the mark is collected and a position of the mark is determined from this diffracted radiation.

It is an object of the present invention to provide an alternative radiation source suitable for use in an alignment sensor which at least partially addresses one or more problems associated with prior art radiation sources, whether identified here or not.

SUMMARY

According to a first aspect of the invention, there is provided a supercontinuum radiation source comprising: a radiation source operable to produce a pulsed radiation beam; an optical amplifier configured to receive the pulsed radiation beam and increase an intensity of the pulsed radiation beam so as to produce an amplified pulsed radiation beam, the optical amplifier comprising a gain medium and a pump power source; and an optical medium configured to receive the amplified pulsed radiation beam and to broaden a spectrum of that amplified pulsed radiation beam so as to generate a supercontinuum radiation beam; wherein the pump power source of the optical amplifier is configured to supply a pump radiation beam to the gain medium, an intensity of the pump radiation beam being periodic and having a pump frequency and wherein the pump frequency is an integer multiple of the frequency of the pulsed radiation beam.

The supercontinuum radiation source may be suitable for a metrology system such as, for example, an alignment mark measurement system.

It will be appreciated that an intensity of a periodic radiation beam having a frequency is intended to mean a radiation beam with an intensity that varies with time in such a way that it repeats after a time period, that time period being the reciprocal of the frequency.

The first aspect of the present invention provides a radiation source that has a broad spectrum, which is particularly useful for alignment mark measurement systems.

Supercontinua are formed as a result of various non-linear optical effects as the pulses of the amplified pulsed radiation beam propagate through the optical medium. There are a plurality of different mechanisms by which a supercontinuum may be formed including, for example, self-phase modulation, four-wave mixing, Raman scattering and soliton fission. In general, supercontinua are formed by a combination of these processes. However, it can be useful to differentiate between different schemes wherein the dominant processes that contribute are different.

In a regime wherein soliton fission dominates, very broad supercontinua can be formed. However, in such a regime the output supercontinuum beam is typically unstable such that there are significant pulse to pulse variations in characteristics of the supercontinuum beam (for example, the spectrum, shape and intensity profile).

In contrast, in a regime wherein self-phase modulation dominates, the supercontinua may have a narrower spectrum than can be formed when soliton fission dominates. However, in a self-phase modulation dominant regime the output supercontinuum beam is typically more stable such that pulse to pulse variations in characteristics of the supercontinuum beam are less significant. Such stability may be desirable for some uses, for example, where the supercontinuum radiation source forms part of an alignment mark measurement system.

Which processes are the dominant processes that contribute to the formation of the supercontinuum may be dependent on the features of the amplified radiation beam such as, for example, the intensity profile of the amplified radiation beam.

In use, the pump power source supplies pump energy, in the form of pump the radiation beam, to the gain medium. This creates a population inversion, which allows the gain medium to amplify the pulsed radiation beam.

As the pulsed radiation beam passes through and is amplified by the gain medium, the intensity profile of individual pulses of the pulsed radiation beam will, in general, be modified. For example, if a radiation pulse with a generally Gaussian longitudinal intensity profile (i.e. in the propagation direction) is received by the optical amplifier and the pump radiation beam is a continuous wave source then the amplified pulsed radiation beam may have a skewed, or asymmetric, longitudinal intensity profile whereby a tail portion of the amplified radiation pulse generally has a greater intensity than a head portion of the pulse.

Advantageously, the first aspect of the invention provides an arrangement whereby the intensity of the pump radiation beam varies with time. In particular, it allows the pump radiation beam to vary with time while the pulsed radiation beam is propagating through the gain medium. This may allow the intensity profile of the amplified radiation beam to be optimized so as to control which dominant processes contribute to the generation of the supercontinuum. For example, it may allow the intensity profile of the amplified radiation beam to be optimized such that self-phase modulation is the dominant processes that contributes to the generation of the supercontinuum. This can result in enhanced pulse to pulse stability of the supercontinuum beam.

Furthermore, although the intensity of the pump radiation beam varies with time, since the pump frequency (of the pump radiation beam) is an integer multiple of the frequency of the pulsed radiation beam, the pump energy supplied to the gain medium as each pulse of the pulsed radiation beam propagates through the gain medium is the same. This can further enhance the pulse to pulse stability of the supercontinuum beam.

Therefore, allowing the rate at which pump energy is supplied to the gain medium to vary as pulses of the pulsed radiation beam propagate through the gain medium allows for temporal pulse shaping of the pulses of the amplified radiation beam. Ultimately, allowing the pump energy supplied to the gain medium to vary can provide better control over the supercontinuum generation process. For example, due to self-steepening effects of short pulses, supercontinuum generation can easily go to the soliton fission regime, which makes the process rather instable. By allowing the pump energy supplied to the gain medium to vary, such effects can be at least partially compensated for. However, due to the non-linear nature of the supercontinuum generation processes, it will be appreciated that it can be difficult, if not impossible, to predict exactly how the intensity of the pump radiation should vary in order compensate for these effects.

The optical medium may comprise one or more waveguides. It will be appreciated that as used here the term "waveguide" means a structure that is configured to guide a wave, in particular an electromagnetic wave. Such a waveguide may form part of an integrated optical system, i.e. it may be provided "on-chip". Alternatively, such a waveguide may be a free space waveguide. Free space waveguides include various different types of optical fibers including, for example, photonic crystal fibers.

The radiation source may be referred to as a seed radiation source and the pulsed radiation beam may be referred to as a seed radiation beam, or pulsed seed radiation beam.

The first frequency may be referred to as a seed frequency. The second frequency may be referred to as a pump frequency.

The intensity of the pump radiation may vary such that the intensity profile of the amplified radiation beam is such that within the optical medium the dominant process that contributes to the generation of the supercontinuum radiation beam is self-phase modulation.

In such a regime, wherein self-phase modulation dominates, pulse to pulse variations in characteristics of the supercontinuum beam are less significant. Such stability may be desirable for some uses, for example, where the supercontinuum radiation source forms part of an alignment mark measurement system.

The intensity of the pump radiation may vary such that the intensity profile of the amplified radiation beam is such that pulse to pulse variations in characteristics of the supercontinuum beam are substantially minimized.

As previously explained, supercontinua are formed as a result of various non-linear optical effects as the pulses of the amplified pulsed radiation beam propagate through the optical medium. Due to the non-linear nature of these processes, it will be appreciated that it can be difficult, if not impossible, to predict exactly how the intensity of the pump radiation should vary in order to either: (a) ensure that the dominant process that contributes to the generation of the supercontinuum radiation beam is self-phase modulation, and/or (b) ensure that pulse to pulse variations in characteristics of the supercontinuum beam are substantially minimized.

It will be further appreciated that, due to the non-linear nature of the supercontinuum generating processes, a suitable time variation of the intensity of the pump radiation that achieves these desirable effects will, in general, vary for different supercontinuum radiation sources.

It will be further appreciated that, due to the non-linear nature of the supercontinuum generating processes, a suitable time variation of the intensity of the pump radiation that achieves these desirable effects may vary with time for a given supercontinuum radiation sources.

However, it will be appreciated that by a process of trial and error, the time dependence of the intensity of the pump radiation beam can be varied whilst simultaneously monitoring either: (a) which is the dominant process that contributes to the generation of the supercontinuum radiation beam is self-phase modulation, and/or (b) pulse to pulse variations in characteristics of the supercontinuum beam. By way of such a process, a suitable time dependence of the intensity of the pump radiation can be found.

The optical amplifier may further comprise an adjustment mechanism configured to provide control over the intensity of the pump radiation beam.

Advantageously, this allows the intensity of the pulsed radiation beam to be adjusted, either initially or periodically. For example, such adjustment may be used so as to optimize the stability of the output of the supercontinuum radiation beam.

The supercontinuum radiation source may further comprise a sensor operable to determine one or more characteristics of the supercontinuum beam.

For example the characteristics of the supercontinuum beam may comprise any of the spectrum, shape and/or intensity profile of the supercontinuum beam.

The sensor may be further operable to output a signal indicative of one or more characteristics of the supercontinuum beam.

The adjustment mechanism may be configured to control the intensity of the pulsed radiation beam in dependence on the signal output by the sensor.

Such an arrangement provides a feedback loop by which adjustment of the intensity of the pulsed radiation beam can be automated, either initially or periodically. The feedback loop may be controlled via the generation of suitable signals from the sensor. The feedback loop may be used so as to maintain one or more characteristics of the output supercontinuum radiation beam. For example, the feedback loop may be used so as to optimize the stability of the output of the supercontinuum radiation beam.

The radiation source may be operable to produce a pulsed radiation beam at a repetition rate of the order of 1 MHz and a pulse duration in the order of 100 ps.

The supercontinuum radiation source may be suitable for an alignment mark measurement system.

The supercontinuum radiation beam may have a power of at least 1 W. Known supercontinuum radiation sources with an output power of this order are possible by using, for example, a photonic crystal fiber as a non-linear optical medium.

The supercontinuum radiation beam may have a spectrum which comprises radiation in the wavelength range of 400 to 2600 nm.

This encompasses radiation from visible light to far infrared light. The supercontinuum radiation beam may therefore have a bandwidth of around 500 THz.

According to a second aspect of the invention there is provided a supercontinuum radiation source comprising: a radiation source operable to produce a pulsed radiation beam comprising a plurality of pulses; an optical amplifier configured to receive the pulsed radiation beam and increase an intensity of the pulsed radiation beam so as to produce an amplified pulsed radiation beam, the optical amplifier comprising a gain medium and a pump power source; and an optical medium configured to receive the amplified pulsed radiation beam and to broaden a spectrum of that amplified pulsed radiation beam so as to generate a supercontinuum radiation beam; wherein the pump power source of the optical amplifier is configured to supply pump energy to the gain medium when the pulses of the pulsed radiation beam propagate through the gain medium and to not supply pump energy to the gain medium for at least a portion of the time between the arrival of two consecutive pulses of the pulsed radiation beam at the gain medium.

The supercontinuum radiation source may be suitable for a metrology system such as, for example, an alignment mark measurement system.

The second aspect of the present invention provides a radiation source that has a broad spectrum, which is particularly useful for alignment mark measurement systems. Supercontinua are formed as a result of various non-linear optical effects as the pulses of the amplified pulsed radiation beam propagate through the optical medium.

In use, the pump power source supplies pump energy, in the form of pump the radiation beam, to the gain medium. This creates a population inversion, which allows the gain medium to amplify the pulsed radiation beam.

Having the pump power source of the optical amplifier configured so as to not supply pump energy to the gain medium for at least a portion of the time between the arrival of two consecutive pulses of the pulsed radiation beam at the gain medium is advantageous because it can significantly increase the lifetime of the optical amplifier.

The gain medium of optical amplifiers is typically continuously supplied with pump energy. This is because it is desirable that once a pulse has propagated through the gain medium, depleting the population inversion, the gain medium be pumped immediately to ensure that the population inversion is created again before the arrival of the next pulse. This being the case, the skilled person would not contemplate an arrangement wherein the gain medium of optical amplifier is intermittently supplied with pump energy (by not supplying pump energy to the gain medium for at least a portion of the time between the arrival of two consecutive pulses of the pulsed radiation beam at the gain medium).

Furthermore, the inventor has realized that such an arrangement wherein the gain medium of an optical amplifier is intermittently supplied with pump energy is particularly well suited for use in a supercontinuum radiation source. This is because in order to achieve the spectral broadening in the optical medium, typically relatively short pulses and small duty cycles are used. In addition, in order to have sufficient power for an alignment mark measurement system, typically a relatively high power pulsed supercontinuum radiation beam is desired. This is achieved by having an optical amplifier that achieves a high amplification. In turn, this implies that a high level of pump energy is used. The second aspect of the present invention allows the optical amplifier to potentially achieve a high amplification factor whilst still having a relatively long lifetime.

Finally, the second aspect of the present invention may allow the level of any cooling of the optical amplifier that is provided to be reduced.

The optical medium may comprise one or more waveguides. It will be appreciated that as used here the term "waveguide" means a structure that is configured to guide a wave, in particular an electromagnetic wave. Such a waveguide may form part of an integrated optical system, i.e. it may be provided "on-chip". Alternatively, such a waveguide may be a free space waveguide. Free space waveguides include various different types of optical fibers including, for example, photonic crystal fibers.

The radiation source may be referred to as a seed radiation source and the pulsed radiation beam may be referred to as a seed radiation beam, or pulsed seed radiation beam.

The pump power source of the optical amplifier may be configured to supply pump energy to the gain medium for a first time period, the first time period starting before a pulse of the pulsed radiation beam enters the gain medium finishing after the pulse of the pulsed radiation beam exits the gain medium.

It will be appreciated that the first time period may start a sufficient period of time before the pulse of the pulsed radiation beam enters the gain medium to allow a population inversion to be achieved in the gain medium. It will be further appreciated that said period of time may be dependent on the type of gain medium and the pump energy source.

The gain medium of the optical amplifier may be provided in an optical fiber along which the pulsed radiation beam can propagate. The pump power source may comprise a pump radiation source operable to supply a pump radiation beam that propagates along said optical fiber.

For example, at least a core of the optical fiber may be doped to form the gain medium. Therefore, the optical amplifier may be generally of the form of a doped fiber amplifier. The pump radiation source may be a laser diode.

With such an arrangement, the pulsed radiation beam (which is amplified by the optical amplifier) and the pump radiation beam co-propagate along the optical fiber.

The pump power source of the optical amplifier may be configured to supply a pump radiation beam to the gain medium, an intensity of the pump radiation beam being periodic and having a pump frequency and wherein the pump frequency is an integer multiple of the frequency of the pulsed radiation beam.

This can provide greater control over the supercontinuum radiation source. Since the pump radiation beam is periodic, the intensity of the pump radiation beam varies with time, which may allow the intensity profile of the amplified radiation beam to be optimized so as to control which dominant processes contribute to the generation of the supercontinuum. This can result in enhanced pulse to pulse stability of the supercontinuum beam. Furthermore, since the pump frequency is an integer multiple of the frequency of the pulsed radiation beam, the pump energy supplied to the gain medium as each pulse of the pulsed radiation beam propagates through the gain medium is the same. This can further enhance the pulse to pulse stability of the supercontinuum beam.

The radiation source may be operable to produce a pulsed radiation beam at a repetition rate of the order of 1 MHz and a pulse duration in the order of 100 ps.

The supercontinuum radiation source may be suitable for a metrology system such as, for example, an alignment mark measurement system.

The supercontinuum radiation beam may have a power of at least 1 W. Known supercontinuum radiation sources with an output power of this order are possible by using, for example, a photonic crystal fiber as a non-linear optical medium.

The supercontinuum radiation beam may have a spectrum which comprises radiation in the wavelength range of 400 to 2600 nm.

This encompasses radiation from visible light to far infrared light. The supercontinuum radiation beam may therefore have a bandwidth of around 500 THz.

According to a third aspect of the invention there is provided an optical measurement system comprising the supercontinuum radiation source according to the first or second aspects of the invention.

According to a fourth aspect of the invention there is provided an alignment mark measurement system comprising: the supercontinuum radiation source according to the first or second aspects of the invention; an optical system operable to project the supercontinuum radiation beam onto an alignment mark on a substrate supported on a substrate table; a sensor operable to detect radiation diffracted/scattered by the alignment mark and to output a signal containing information related to a position of the alignment mark; and a processor configured to receive the signal from the sensor and to determine a position of the alignment mark relative to the substrate table in dependence thereon.

According to a fifth aspect of the invention there is provided a lithographic apparatus comprising the alignment mark measurement system according to the fourth aspect of the invention.

According to a sixth aspect of the invention there is provided a method for generating a supercontinuum radiation beam, the method comprising: producing a pulsed radiation beam; passing the pulsed radiation beam through a gain medium of an optical amplifier; supplying a pump energy to the gain medium so that as the pulsed radiation beam propagates through the gain medium an intensity of the pulsed radiation beam increases so as to produce an amplified pulsed radiation beam, wherein the pump energy is supplied to the gain medium as a pump radiation beam, an intensity of the pump radiation beam being periodic and having a pump frequency that is an integer multiple of the frequency of the pulsed radiation beam; and passing the amplified pulsed radiation beam through an optical medium configured to broaden a spectrum of that amplified pulsed radiation beam so as to generate a supercontinuum radiation beam.

The method according to the sixth aspect corresponds to a mode of operation of the supercontinuum radiation source according to the first aspect of the present invention. The method according to the sixth aspect of the invention is therefore advantageous over existing methods, as discussed above in connection with the supercontinuum radiation source of the first aspect of the invention.

Where applicable, the method according to the sixth aspect of the invention may have features corresponding to any of the above-described features of the supercontinuum radiation source according to the first aspect of the present invention.

The intensity of the pump radiation may vary such that the intensity profile of the amplified radiation beam is such that within the optical medium the dominant process that contributes to the generation of the supercontinuum radiation beam is self-phase modulation.

The intensity of the pump radiation may vary such that the intensity profile of the amplified radiation beam is such that pulse to pulse variations in characteristics of the supercontinuum beam are substantially minimized.

The method may further comprise: determining one or more characteristics of the supercontinuum beam; and in dependence the one or more determined characteristics of the supercontinuum beam adjusting the intensity of the pulsed radiation beam.

Such an arrangement provides a feedback loop by which adjustment of the intensity of the pulsed radiation beam can be automated, either initially or periodically. The feedback loop may be used so as to maintain one or more characteristics of the output supercontinuum radiation beam. For example, the feedback loop may be used so as to optimize the stability of the output of the supercontinuum radiation beam.

According to a seventh aspect of the invention there is provided a method for generating a supercontinuum radiation beam, the method comprising: producing a pulsed radiation beam comprising a plurality of pulses; passing the pulsed radiation beam through a gain medium of an optical amplifier; supplying a pump energy to the gain medium so that as the pulsed radiation beam propagates through the gain medium an intensity of the pulsed radiation beam increases so as to produce an amplified pulsed radiation beam, wherein pump energy is supplied to the gain medium when the pulses of the pulsed radiation beam propagate through the gain medium and pump energy is not supplied to the gain medium for at least a portion of the time between the arrival of two consecutive pulses of the pulsed radiation beam at the gain medium; and passing the amplified pulsed radiation beam through an optical medium configured to broaden a spectrum of that amplified pulsed radiation beam so as to generate a supercontinuum radiation beam.

The method according to the seventh aspect corresponds to a mode of operation of the supercontinuum radiation source according to the second aspect of the present invention. The method according to the seventh aspect of the invention is therefore advantageous over existing methods, as discussed above in connection with the supercontinuum radiation source of the second aspect of the invention.

Where applicable, the method according to the seventh aspect of the invention may have features corresponding to any of the above-described features of the supercontinuum radiation source according to the second aspect of the present invention.

The pump energy may be supplied to the gain medium as a pump radiation beam. An intensity of the pump radiation beam may be periodic and may have a pump frequency. The pump frequency may be an integer multiple of the frequency of the pulsed radiation beam.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
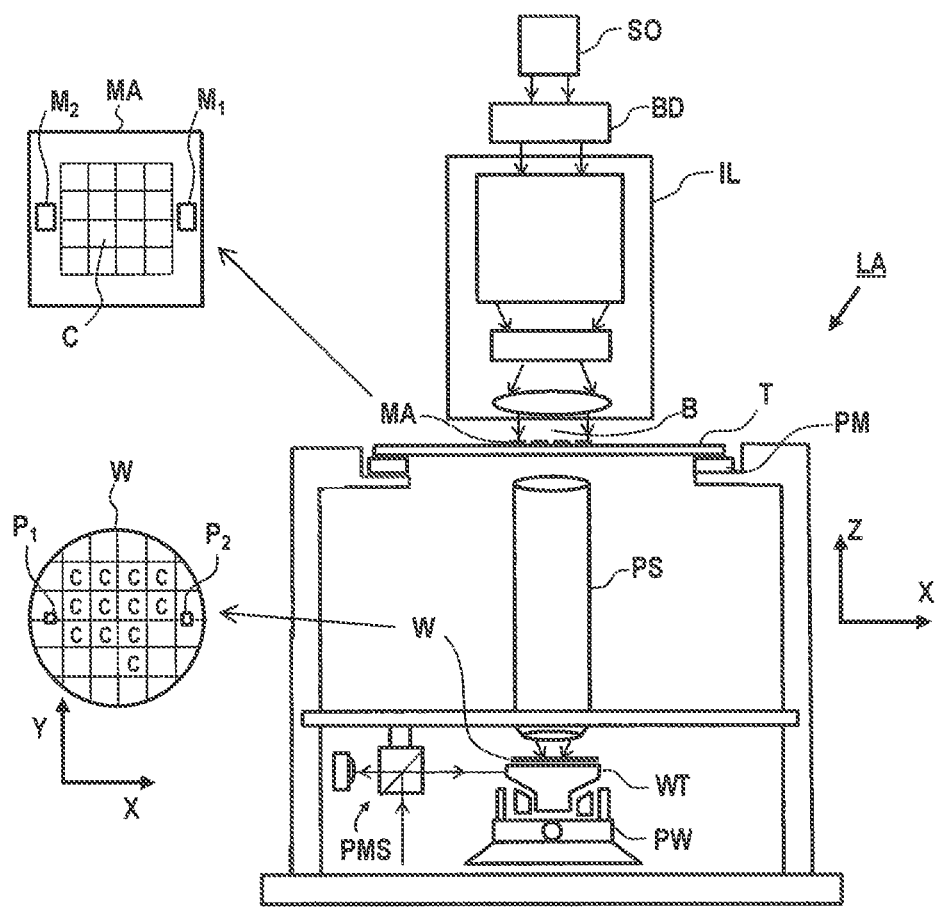
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 2:
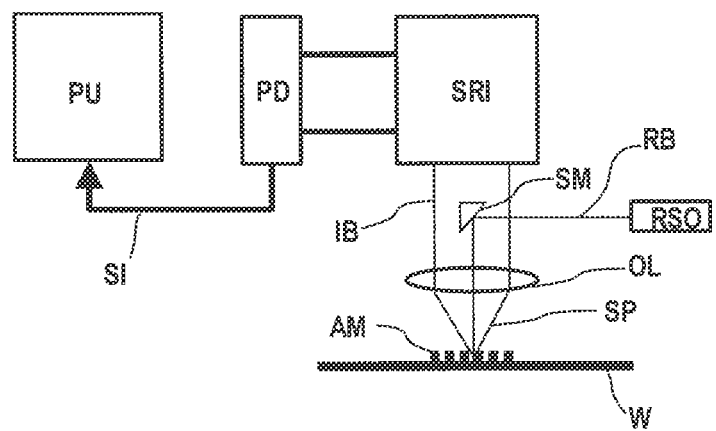
FIG. 2 is a schematic block diagram of an alignment sensor scanning an alignment mark in the apparatus of FIG. 1.

FIG. 2 is a schematic block diagram of an embodiment of a known alignment sensor AS, such as is described, for example, in U.S. Pat. No. 6,961,116, and which is incorporated by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam 1B comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

Figure 3:
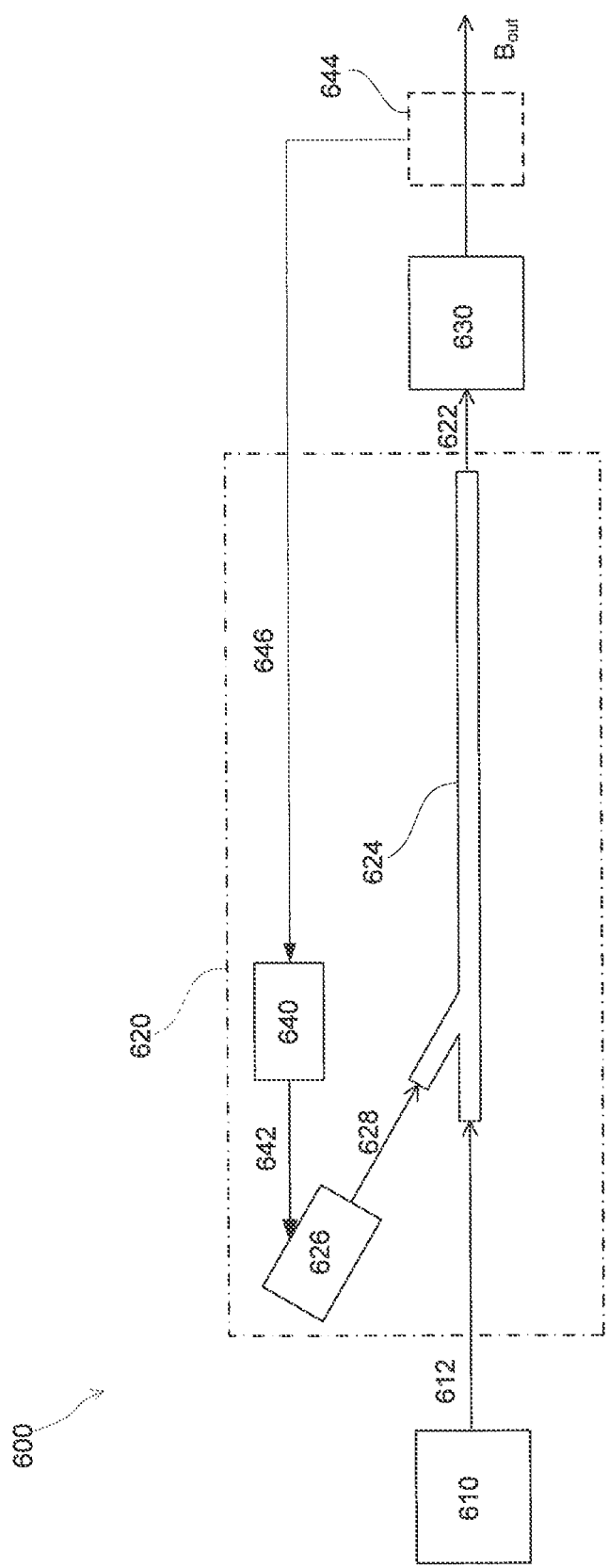
FIG. 3 is a schematic representation of a supercontinuum radiation source according to an embodiment of the present invention, which may form part of the alignment sensor of FIG. 2.

FIG. 3 is a schematic representation of a supercontinuum radiation source 600 according to an embodiment of the present invention. The supercontinuum radiation source 600 comprises a radiation source 610, an optical amplifier 620 and a non-linear optical medium 630.

The radiation source 610 is operable to produce a pulsed radiation beam 612. It will be appreciated that a pulsed radiation beam 612 comprises a plurality of sequential, discrete and temporally separated pulses of radiation. The pulsed radiation beam 612 may, typically, have a generally constant pulse frequency, which may be of the order of 20-80 MHz. In some embodiments, the radiation source 610 may be operable to produce a pulsed radiation beam 612 at a repetition rate of the order of 1 MHz and a pulse duration in the order of 100 ps. The radiation source 610 may comprise a laser. The laser may, for example, comprise a mode-locked laser. Suitable lasers may include fiber lasers such as, for example a ytterbium-doped (Yb-doped) fiber laser. Other suitable lasers may include a titanium-sapphire (Ti:Sapphire) laser. The individual pulses of radiation may have a duration of the order of 0.1-100 ps.

The optical amplifier 620 is configured to receive the pulsed radiation beam 612 and increase an intensity of the pulsed radiation beam so as to produce an amplified pulsed radiation beam 622. The optical amplifier 620 comprises a gain medium 624 and a pump power source 626. In the embodiment shown in FIG. 3, the gain medium 624 of the optical amplifier 620 is provided in an optical fiber along which the pulsed radiation beam 612 can propagate and the pump power source 626 comprises a pump radiation source operable to supply a pump radiation beam 628 that propagates along said optical fiber. With such an arrangement, the pulsed radiation beam 612 (which is amplified by the optical amplifier 620) and the pump radiation beam 628 co-propagate along the optical fiber. At least a core of the optical fiber may be doped to form the gain medium 624. Therefore, the optical amplifier 620 of this embodiment is generally of the form of a doped fiber amplifier. The pump radiation source 626 may be a laser diode. It will be appreciated that in alternative embodiments the gain medium of the optical amplifier may be provided not in an optical fiber.

The non-linear optical medium 630 is configured to receive the amplified pulsed radiation beam 622 and to broaden a spectrum of that amplified pulsed radiation beam 622 so as to generate a supercontinuum radiation beam $B_{out}$. The non-linear optical medium 630 has suitable non-linear optical properties to allow for the generation of such a supercontinuum.

The optical medium 630 may comprise one or more waveguides. It will be appreciated that as used here the term "waveguide" means a structure that is configured to guide a wave, in particular an electromagnetic wave. Such a waveguide may form part of an integrated optical system, i.e. it may be provided "on-chip". Alternatively, such a waveguide may be a free space waveguide. Free space waveguides include various different types of optical fibers including, for example, photonic crystal fibers. It will be appreciated that in alternative embodiments the optical medium may be not of the form of one or more waveguides.

The supercontinuum radiation source 600 may be suitable for use within a metrology system, for example a substrate alignment system within a lithographic apparatus. For example, the supercontinuum radiation source 600 may correspond to the illumination source RSO shown in FIG. 2 and the supercontinuum radiation beam $B_{out}$ may correspond to the radiation beam RB.

The supercontinuum radiation beam $B_{out}$ may have a power of at least 1 W. The supercontinuum radiation source 600 is operable to produce a supercontinuum radiation beam $B_{out}$ with a relatively broad spectrum. For example, the supercontinuum radiation beam $B_{out}$ with may have a spectrum that extends from the visible range to far infrared, for example the spectrum may extend from 400 nm to 2500 nm. The supercontinuum radiation beam may therefore have a bandwidth of around 500 THz. Such a radiation beam $B_{out}$ is particularly useful for any application where it is beneficial to provide a broadband radiation beam. For example, radiation beam $B_{out}$ may be particularly useful for use in substrate alignment systems such as, for example, the alignment sensor shown in FIG. 2.

The radiation source 610 may be referred to as a seed radiation source and the pulsed radiation beam 612 may be referred to as a seed radiation beam, or pulsed seed radiation beam. A frequency of the pulsed radiation beam 612 may be referred to as a first frequency or a seed frequency.

In some embodiments, an intensity of the pump radiation beam 628 is periodic and has a frequency that is an integer multiple of the frequency of the pulsed radiation beam 612. Such an arrangement is advantageous for a number of reasons, as now discussed. A frequency of the intensity of the pump radiation beam 628 may be referred to as a second frequency or a pump frequency.

It will be appreciated that an intensity of a periodic radiation beam having a frequency is intended to mean a radiation beam with an intensity that varies with time in such a way that it repeats after a time period, that time period being the reciprocal of the frequency.

The supercontinuum is formed as a result of various non-linear optical effects as the pulses of the amplified pulsed radiation beam 622 propagate through the optical medium 630. There are a plurality of different mechanisms by which a supercontinuum may be formed including, for example, self-phase modulation, four-wave mixing, Raman scattering and soliton fission. In general, supercontinua are formed by a combination of these processes. However, it can be useful to differentiate between different schemes wherein the dominant processes that contribute are different.

In a regime wherein soliton fission dominates, very broad supercontinua can be formed. However, in such a regime the output supercontinuum beam is typically unstable such that there are significant pulse to pulse variations in characteristics of the supercontinuum beam (for example, the spectrum, shape and intensity profile).

In contrast, in a regime wherein self-phase modulation dominates, the supercontinua may have a narrower spectrum than can be formed when soliton fission dominates. However, in a self-phase modulation dominant regime the output supercontinuum beam $B_{out}$ is typically more stable such that pulse to pulse variations in characteristics of the supercontinuum beam $B_{out}$ are less significant. Such stability may be desirable for some uses, for example, where the supercontinuum radiation source 600 forms part of an alignment mark measurement system.

Which processes are the dominant processes that contribute to the formation of the supercontinuum may be dependent on the features of the amplified radiation beam 622 such as, for example, the intensity profile of the amplified radiation beam 622.

In use, the pump power source 626 supplies pump energy, in the form of pump the radiation beam 628, to the gain medium 624. This creates a population inversion, which allows the gain medium 624 to amplify the pulsed radiation beam 612.

As the pulsed radiation beam 612 passes through and is amplified by the gain medium 624, the intensity profile of individual pulses of the pulsed radiation beam 612 will, in general, be modified. For example, if a radiation pulse with a generally Gaussian longitudinal intensity profile (i.e. in the propagation direction) is received by the optical amplifier 620 and the pump radiation beam 628 is a continuous wave source then the amplified pulsed radiation beam may have a skewed, or asymmetric, longitudinal intensity profile whereby a tail portion of the amplified radiation pulse 622 generally has a greater intensity than a head portion of the pulse.

Advantageously, by configuring the pump power source 626 such that the intensity of the pump radiation beam 628 is periodic and has a frequency that is an integer multiple of the frequency of the pulsed radiation beam 612 the intensity of the pump radiation beam 628 varies with time. In particular, the intensity of the pump radiation beam 628 varies with time (for example over the time taken for pulses of the pulsed radiation beam 612 to propagate through the gain medium 624), whilst ensuring that substantially the same pump energy is supplied to the gain medium 624 to each pulse of the pulsed radiation beam 612. This can enhance the pulse to pulse stability of the supercontinuum beam $B_{out}$.

In particular, the time variation of the intensity of the pump radiation beam 628 allows the pump radiation beam 626 to vary with time while the pulsed radiation beam is propagating through the gain medium 624. This may allow the intensity profile of the amplified radiation beam 622 to be optimized so as to control which dominant processes contribute to the generation of the supercontinuum. For example, it may allow the intensity profile of the amplified radiation beam 222 to be optimized that self-phase modulation is the dominant processes that contributes to the generation of the supercontinuum. This can result in enhanced pulse to pulse stability of the supercontinuum beam $B_{out}$.

Some examples of the intensity of the pump radiation beam 628 being periodic and having a frequency that is an integer multiple of the frequency of the pulsed radiation beam 612 are now discussed with reference to FIGS. 4 to 8.

Figure 4:
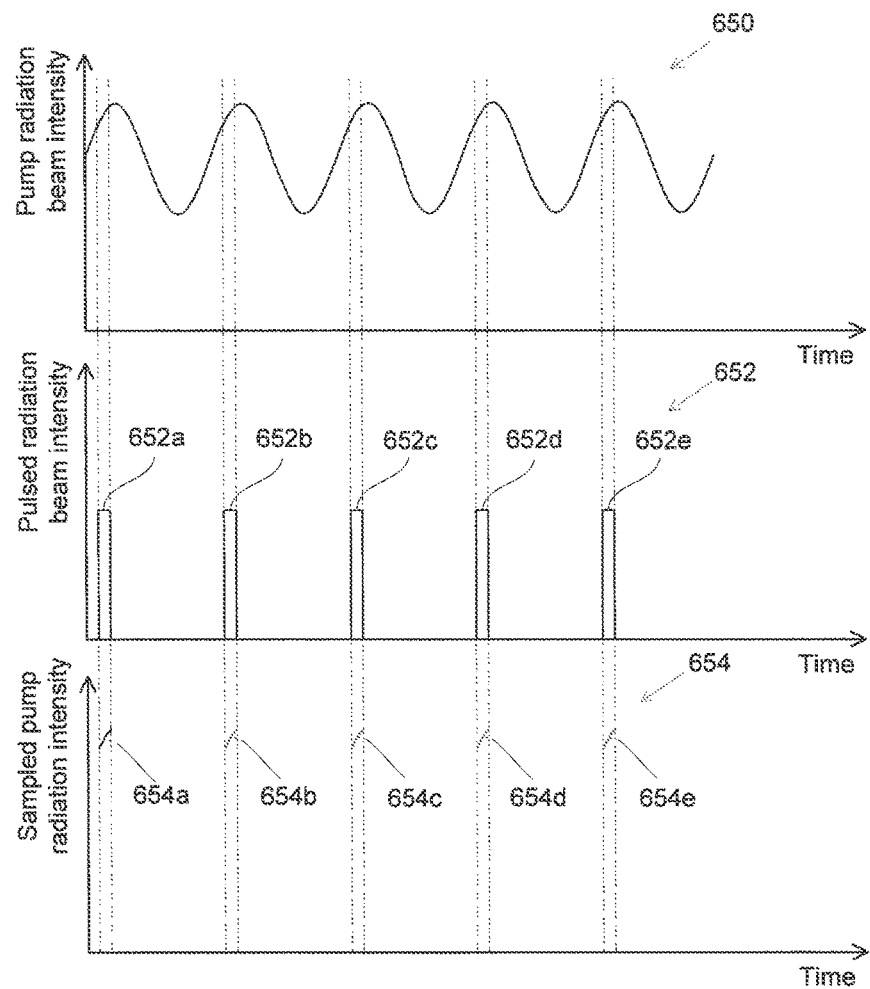
FIG. 4 shows, for the supercontinuum radiation source shown in FIG. 3, a schematic illustration of a first example of: a temporal intensity distribution of a pump radiation beam; a temporal intensity distribution of a pulsed radiation beam to be amplified; and a sampled or effective pump radiation temporal distribution.

FIG. 4 shows a temporal intensity distribution 650 of the pump radiation beam 628 and a temporal intensity distribution 652 of the pulsed radiation beam 612. In this example, the temporal intensity distribution 650 of the pump radiation beam 628 is generally sinusoidal. The temporal intensity distribution 652 of the pulsed radiation beam 612 comprises a plurality of discrete pulses 652a-652e. For ease of understanding, each of the pulses 652a-652e is of the form of a square wave pulse although it will be appreciated that in other examples, the pulses may have a different shape (for example Gaussian).

Also shown in FIG. 4 is a sampled or effective pump radiation temporal distribution 654. The sampled temporal distribution 654 is effectively formed from a plurality of discrete portions 654a-654e of the intensity of the pump radiation beam 628, each portion 654a-654e being a portion of the temporal intensity distribution 650 of the pump radiation beam 628 for the duration of one of the pulses 652a-652e of the pulsed radiation beam 612. The sampled temporal distribution 654 may be a convolution of temporal intensity distribution 650 of the pump radiation beam 628 and the temporal intensity distribution 652 of the pulsed radiation beam 612.

Each portion 654a-654e of the sampled temporal distribution 654 is effectively the pump radiation that is experienced by a one of the pulses 652a-652e of the pulsed radiation beam 612. Furthermore, different parts of each portion 654a-654e of the sampled temporal distribution 654 are effectively the pump radiation that is experienced by different parts of the corresponding pulses 652a-652e of the pulsed radiation beam 612. Since the temporal intensity distribution 650 of the pump radiation beam 628 varies with time, the amount of pump energy experienced by different parts of each pulse 652a-652e of the pulsed radiation beam 612 is, in general different. For example, each portion 654a-654e of the sampled temporal distribution 654 corresponds to a portion of the sampled temporal distribution 654 wherein the sampled temporal distribution 654 is increasing with time. Therefore, in this example, a tail portion of each pulse of the pulsed radiation beam 612 experiences a greater amount of pump radiation than a head portion of the pulse of the pulsed radiation beam 612. As a result, in this example, the tail portion of each pulse of the pulsed radiation beam 612 may be amplified more that the head portion of the pulse of the pulsed radiation beam 612.

The frequency of the temporal intensity distribution 650 of the pump radiation beam 628 and is equal to the frequency of the temporal intensity distribution 652 of the pulsed radiation beam 612. As a result, although different parts of the same pulse of the pulsed radiation beam 612 experience different amounts of pump radiation, each pulse of the pulsed radiation beam 612 experiences the same pump radiation as other pulses. This can result in enhanced pulse to pulse stability of the supercontinuum beam $B_{out}$ whilst providing the control over the amount of pump radiation experienced by different parts of each pulse. As explained above, this may allow the intensity profile of the amplified radiation beam 622 to be optimized so as to control which dominant processes that contribute to the generation of the supercontinuum. For example, it may allow the intensity profile of the amplified radiation beam 222 to be optimized such that self-phase modulation is the dominant processes that contributes to the generation of the supercontinuum.

Figure 5:
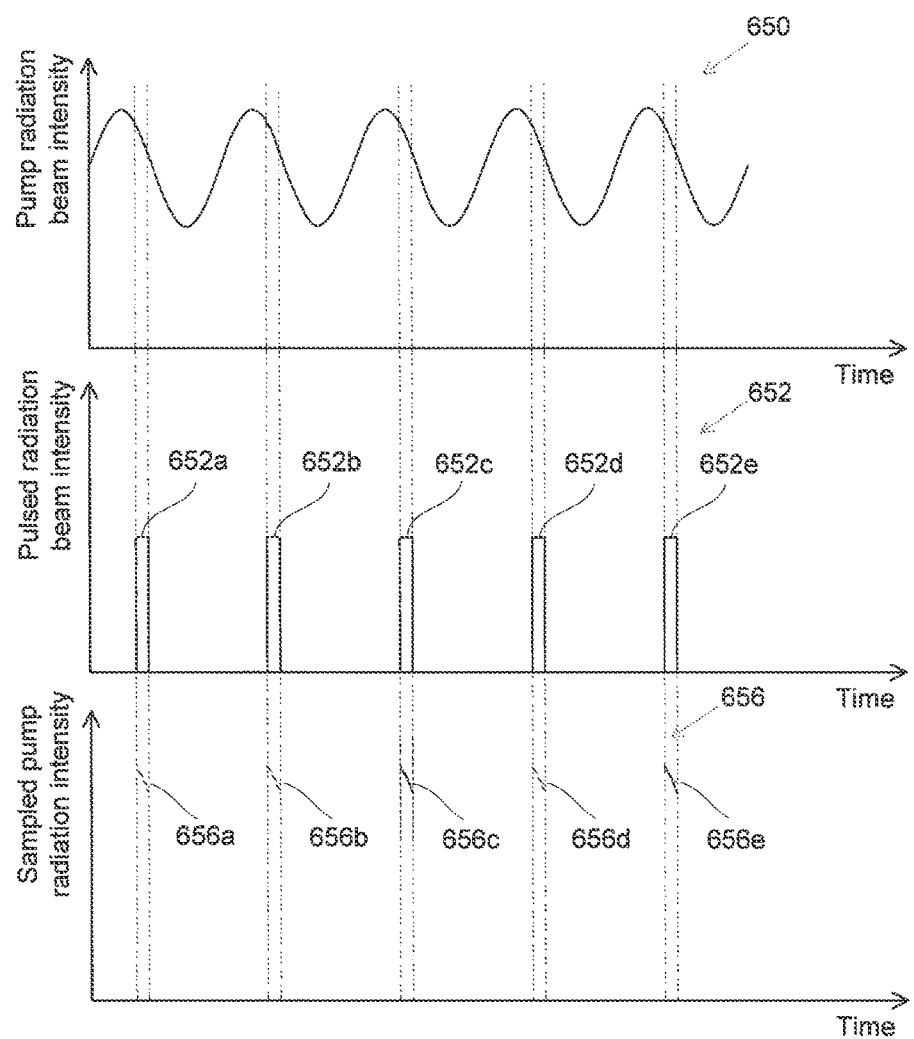
FIG. 5 shows, for the supercontinuum radiation source shown in FIG. 3, a schematic illustration of a second example of: a temporal intensity distribution of a pump radiation beam; a temporal intensity distribution of a pulsed radiation beam to be amplified; and a sampled or effective pump radiation temporal distribution.
Figure 6:
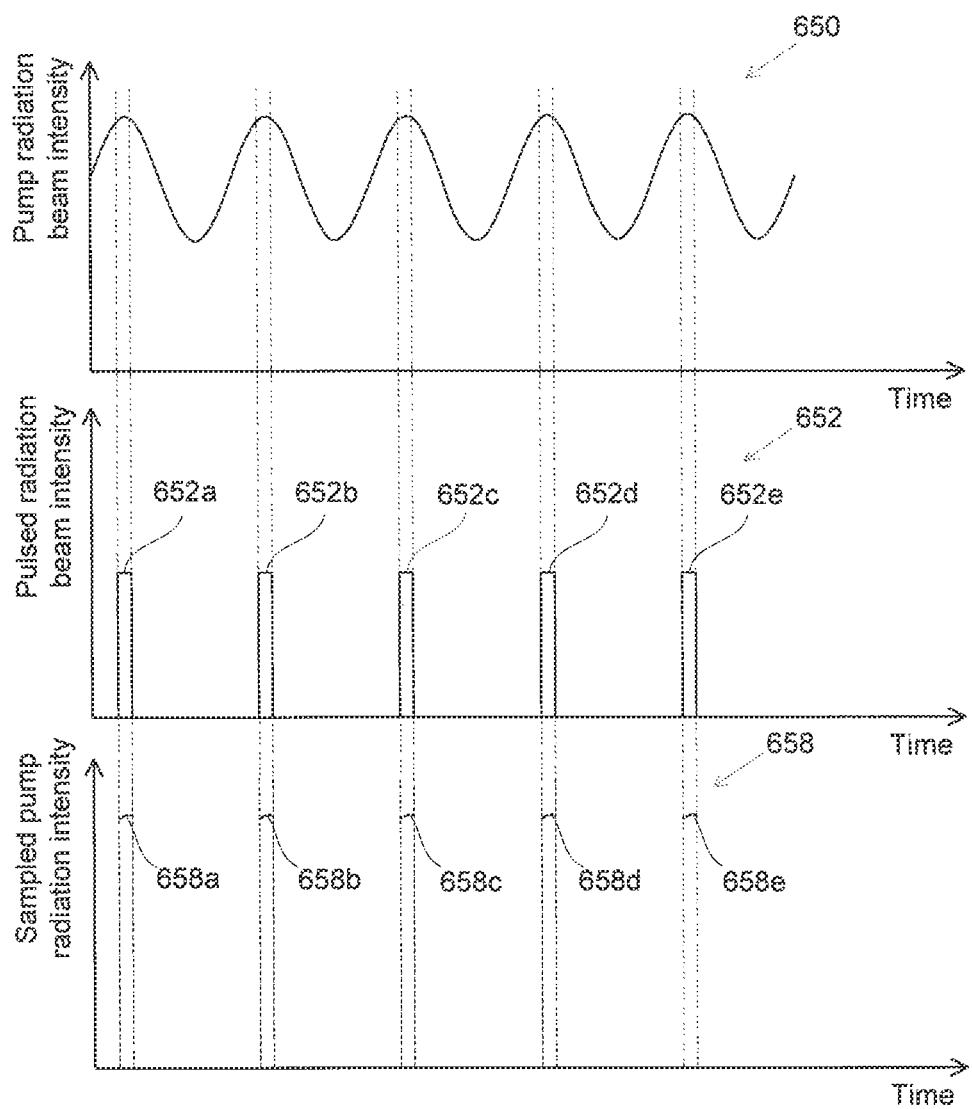
FIG. 6 shows, for the supercontinuum radiation source shown in FIG. 3, a schematic illustration of a third example of: a temporal intensity distribution of a pump radiation beam; a temporal intensity distribution of a pulsed radiation beam to be amplified; and a sampled or effective pump radiation temporal distribution.

FIGS. 5 and 6 show two variations of the example shown in FIG. 4. FIGS. 5 and 6 both show the same temporal intensity distribution 650 of the pump radiation beam 628 and a temporal intensity distribution 652 of the pulsed radiation beam 612 as shown in FIG. 4. As in FIG. 4, in FIGS. 5 and 6 the frequency of the temporal intensity distribution 650 of the pump radiation beam 628 and is equal to the frequency of the temporal intensity distribution 652 of the pulsed radiation beam 612. However, a phase difference between the two temporal intensity distributions 650, 652 is different for each of FIGS. 4, 5 and 6. As a result, the sampled or effective pump radiation temporal distribution 654 is different for each of these Figures.

FIG. 5 shows a second sampled temporal distribution 656 that is formed from a plurality of discrete portions 656a-656e of the intensity of the pump radiation beam 628, each portion 656a-656e being a portion of the temporal intensity distribution 650 of the pump radiation beam 628 for the duration of one of the pulses 652a-652e of the pulsed radiation beam 612. Each portion 656a-656e of the sampled temporal distribution 656 corresponds to a portion of the sampled temporal distribution 656 wherein the sampled temporal distribution 654 is decreasing with time. Therefore, in the example shown in FIG. 5, a head portion of each pulse of the pulsed radiation beam 612 experiences a greater amount of pump radiation than a tail portion of the pulse of the pulsed radiation beam 612.

Similarly, FIG. 6 shows a third sampled temporal distribution 658 that is formed from a plurality of discrete portions 658a-658e of the intensity of the pump radiation beam 628, each portion 658a-658e being a portion of the temporal intensity distribution 650 of the pump radiation beam 628 for the duration of one of the pulses 652a-652e of the pulsed radiation beam 612. Each portion 658a-658e of the sampled temporal distribution 658 corresponds to a portion of the sampled temporal distribution 658 containing a maximum. Therefore, in the example shown in FIG. 6, a central head portion of each pulse of the pulsed radiation beam 612 experiences a greater amount of pump radiation than a tail portion and a head portion of the pulse of the pulsed radiation beam 612.

Figure 7:
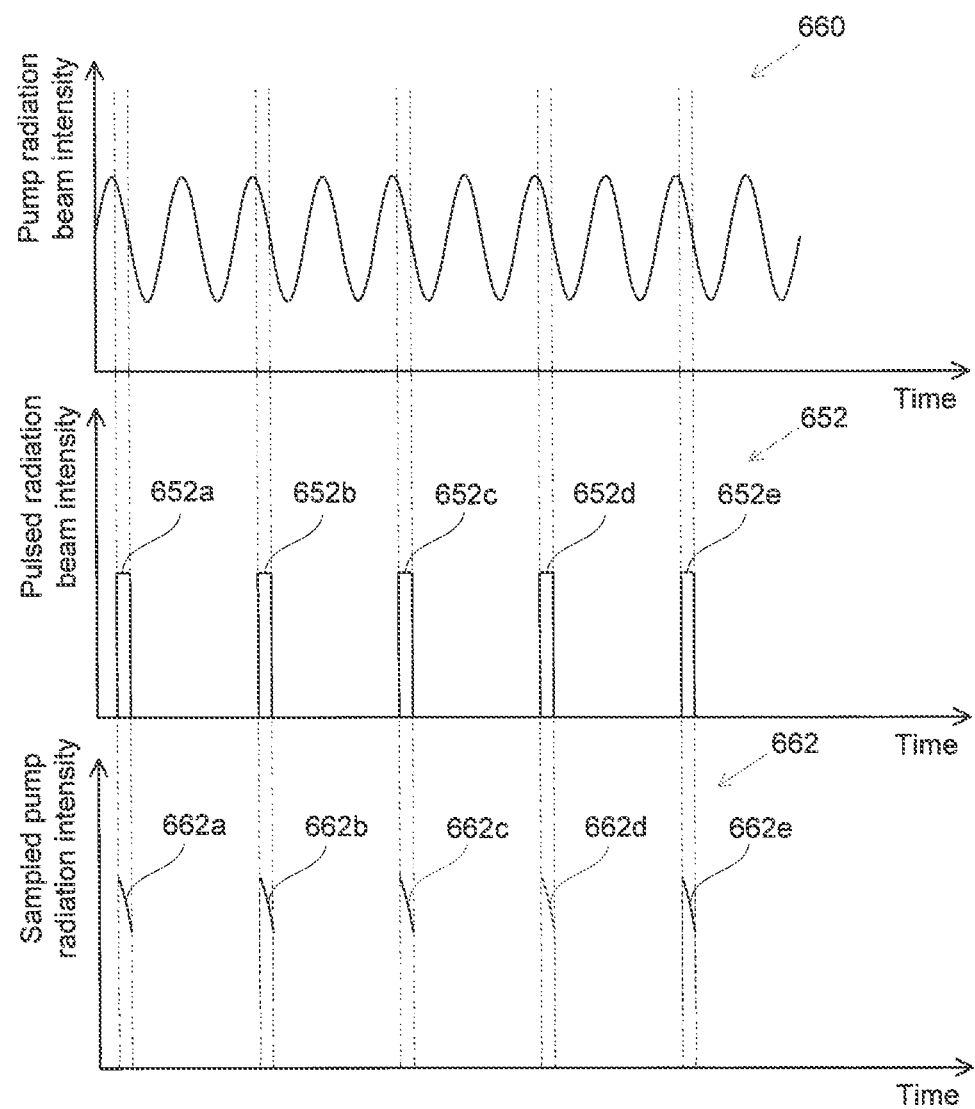
FIG. 7 shows, for the supercontinuum radiation source shown in FIG. 3, a schematic illustration of a fourth example of: a temporal intensity distribution of a pump radiation beam; a temporal intensity distribution of a pulsed radiation beam to be amplified; and a sampled or effective pump radiation temporal distribution.

FIG. 7 shows another variation of the examples shown in FIGS. 4 to 6. FIG. 7 shows the same temporal intensity distribution 652 of the pulsed radiation beam 612 as shown in FIGS. 4 to 6. FIG. 7 also shows a different temporal intensity distribution 660 of the pump radiation beam 628. In contrast to the examples shown in FIGS. 4 to 6, in FIG. 7 the frequency of the temporal intensity distribution 660 of the pump radiation beam 628 and is equal to twice the frequency of the temporal intensity distribution 652 of the pulsed radiation beam 612.

Also shown in FIG. 7 is a different sampled or effective pump radiation temporal distribution 662. The sampled temporal distribution 662 is effectively formed from a plurality of discrete portions 662a-662e of the intensity of the pump radiation beam 628, each portion 662a-662e being a portion of the temporal intensity distribution 660 of the pump radiation beam 628 for the duration of one of the pulses 652a-652e of the pulsed radiation beam 612.

In comparison to the examples shown in FIGS. 4 to 6, by selecting the frequency of the temporal intensity distribution 660 of the pump radiation beam 628 to be twice the frequency of the temporal intensity distribution 652 of the pulsed radiation beam 612, for the same temporal duration of the pulses 652a-652e of the pulsed radiation beam 612 a greater variation in the amount of pump radiation experienced by different parts of the pulses can be achieved.

In general, the intensity of the pump radiation beam 628 is periodic and has a frequency that is an integer multiple of the frequency of the pulsed radiation beam 612.

Figure 8:
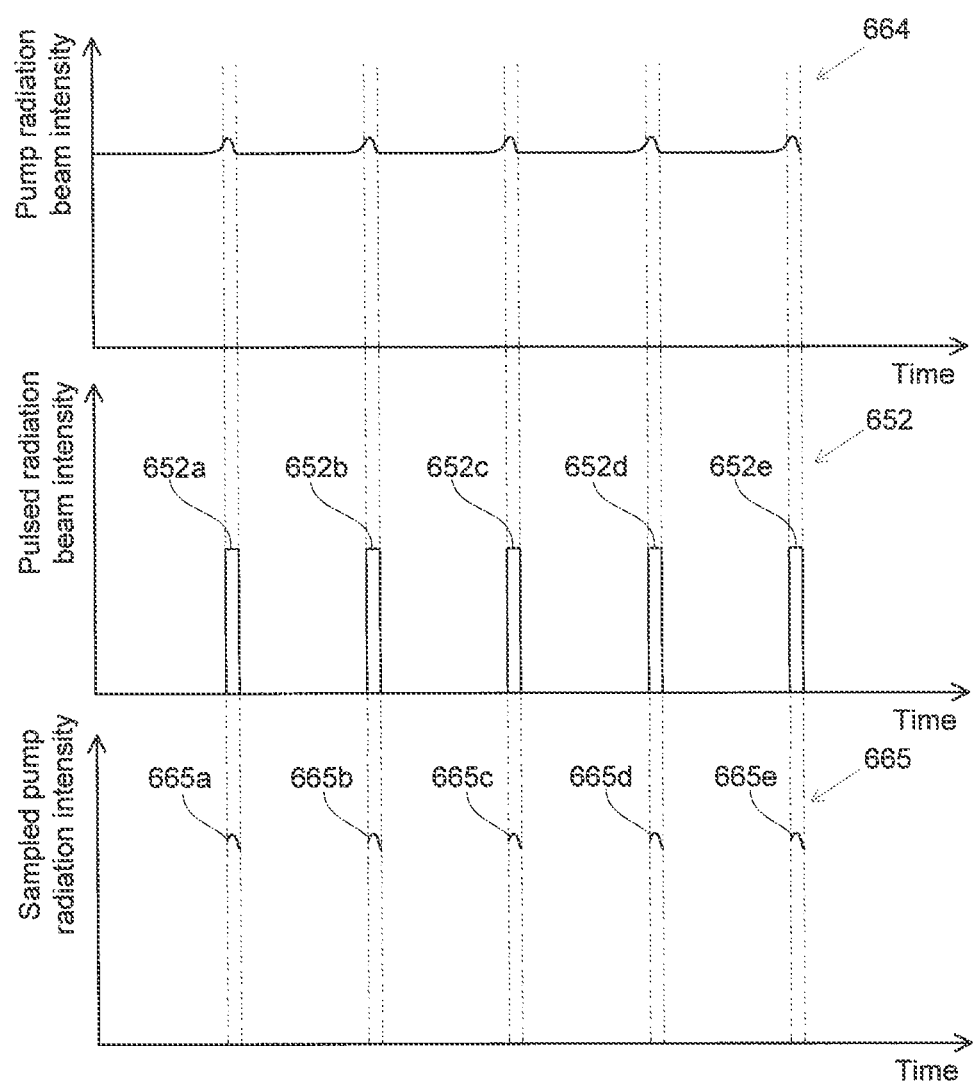
FIG. 8 shows, for the supercontinuum radiation source shown in FIG. 3, a schematic illustration of a fifth example of: a temporal intensity distribution of a pump radiation beam; a temporal intensity distribution of a pulsed radiation beam to be amplified; and a sampled or effective pump radiation temporal distribution.

FIG. 8 shows another variation of the examples shown in FIGS. 4 to 7, FIG. 8 shows the same temporal intensity distribution 652 of the pulsed radiation beam 612 as shown in FIGS. 4 to 7. FIG. 7 also shows a different temporal intensity distribution 664 of the pump radiation beam 628. The frequency of the temporal intensity distribution 664 of the pump radiation beam 628 and is equal to the frequency of the temporal intensity distribution 652 of the pulsed radiation beam 612.

Also shown in FIG. 8 is a different sampled or effective pump radiation temporal distribution 665. The sampled temporal distribution 665 is effectively formed from a plurality of discrete portions 665a-665e of the intensity of the pump radiation beam 628, each portion 665a-665e being a portion of the temporal intensity distribution 664 of the pump radiation beam 628 for the duration of one of the pulses 652a-652e of the pulsed radiation beam 612.

Allowing the shape of the periodic intensity of the pump radiation beam 628 to be non-sinusoidal may provide greater control over the variation in the amount of pump radiation experienced by different parts of the pulses. In general, the intensity of the pump radiation beam 628 is periodic, with any temporal shape as desired or appropriate.

Allowing the rate at which pump energy is supplied to the gain medium 624 to vary as pulses of the pulsed radiation beam 612 propagate through the gain medium 624 allows for temporal pulse shaping of the pulses of the amplified radiation beam 622. Ultimately, allowing the pump energy supplied to the gain medium 624 to vary can provide better control over the supercontinuum generation process. For example, due to self-steepening effects of short pulses, supercontinuum generation can easily go to the soliton fission regime, which makes the process rather instable. By allowing the pump energy supplied to the gain medium 624 to vary such effects can be at least partially compensated for. However, due to the non-linear nature of the supercontinuum generation processes, it will be appreciated that it can be difficult, if not impossible, to predict exactly how the intensity of the pump radiation beam 628 should vary in order compensate for these effects.

In some embodiments, the intensity of the pump radiation beam 628 varies such that the intensity profile of the amplified radiation beam 622 is such that within the optical medium 630 the dominant process that contributes to the generation of the supercontinuum radiation beam is self-phase modulation. In such a regime, wherein self-phase modulation dominates, pulse to pulse variations in characteristics of the supercontinuum beam $B_{out}$ are less significant. Such stability may be desirable for some uses, for example, where the supercontinuum radiation source 600 forms part of an alignment mark measurement system.

In some embodiments, the intensity of the pump radiation beam 628 varies such that the intensity profile of the amplified radiation beam 622 is such that pulse to pulse variations in characteristics of the supercontinuum beam $B_{out}$ are substantially minimized.

As previously explained, supercontinua are formed as a result of various non-linear optical effects as the pulses of the amplified pulsed radiation beam 622 propagate through the optical medium 630. Due to the non-linear nature of these processes, it will be appreciated that it can be difficult, if not impossible, to predict exactly how the intensity of the pump radiation beam 628 should vary in order to either: (a) ensure that the dominant process that contributes to the generation of the supercontinuum radiation beam is self-phase modulation, and/or (b) ensure that pulse to pulse variations in characteristics of the supercontinuum beam are substantially minimized.

It will be further appreciated that, due to the non-linear nature of the supercontinuum generating processes, a suitable time variation of the intensity of the pump radiation beam 628 that achieves these desirable effects will, in general, vary for different supercontinuum radiation sources 600. It will be further appreciated that, due to the non-linear nature of the supercontinuum generating processes, a suitable time variation of the intensity of the pump radiation beam 628 that achieves these desirable effects may vary with time for a given supercontinuum radiation source 600.

However, it will be appreciated that by a process of trial and error, the time dependence of the intensity of the pump radiation beam 628 can be varied whilst simultaneously monitoring either: (a) which is the dominant process that contributes to the generation of the supercontinuum radiation beam $B_{out}$ (for example checking whether or not it is self-phase modulation), and/or (b) pulse to pulse variations in characteristics of the supercontinuum beam $B_{out}$. By way of such a process, a suitable time dependence of the intensity of the pump radiation beam 628 can be found.

To enable such optimization methods to be implemented, the supercontinuum radiation sources 600 further comprises additional components that may form part of a feedback loop, as now described.

The optical amplifier 630 further comprises an adjustment mechanism 640 configured to provide control over the intensity of the pump radiation beam 628, as now described.

The adjustment mechanism 640 may be operable to generate a control signal 642. The pump radiation source 626 may be operable to receive the control signal 642. The intensity of the pump radiation beam 628 may be dependent on the control signal 642. Advantageously, this allows the intensity of the pulsed radiation beam 628 to be adjusted, either initially or periodically. For example, such adjustment may be used so as to optimize the stability of the output supercontinuum radiation beam $B_{out}$.

The supercontinuum radiation source 600 further comprises a sensor 644 operable to determine one or more characteristics of the supercontinuum beam $B_{out}$. For example the characteristics of the supercontinuum beam $B_{out}$ may comprise any of: the spectrum, shape and/or intensity profile of the supercontinuum beam $B_{out}$.

The sensor 644 is further operable to output a signal 646 indicative of one or more characteristics of the supercontinuum beam $B_{out}$. The adjustment mechanism 640 is configured to control the intensity of the pulsed radiation beam 628 in dependence on the signal 646 output by the sensor 644. Such an arrangement provides a feedback loop by which adjustment of the intensity of the pulsed radiation beam 628 can be automated, either initially or periodically. The feedback loop may be controlled via the generation of suitable signals 646, 642 from the sensor 644 and/or the adjustment mechanism 640. The feedback loop may be used so as to maintain one or more characteristics of the output supercontinuum radiation beam $B_{out}$. For example, the feedback loop may be used so as to optimize the stability of the output of the supercontinuum radiation beam $B_{out}$.

In some embodiments, the pump power source 626 of the optical amplifier 620 is configured to supply pump energy (for example via pimp radiation beam 628) to the gain medium 624 when the pulses of the pulsed radiation beam 612 propagate through the gain medium 624 and to not supply pump energy to the gain medium 624 for at least a portion of the time between the arrival of two consecutive pulses of the pulsed radiation beam 612 at the gain medium 624. Having the pump power source 626 of the optical amplifier 620 configured so as to not supply pump energy to the gain medium 624 for at least a portion of the time between the arrival of two consecutive pulses of the pulsed radiation beam 612 at the gain medium 624 is advantageous because it can significantly increase the lifetime of the optical amplifier, as now discussed.

The gain medium of optical amplifiers is typically continuously supplied with pump energy. This is because it is desirable that once a pulse has propagated through the gain medium, depleting the population inversion, the gain medium be pumped immediately to ensure that the population inversion is created again before the arrival of the next pulse. This being the case, the skilled person would not contemplate an arrangement wherein the gain medium of optical amplifier is intermittently supplied with pump energy (by not supplying pump energy to the gain medium for at least a portion of the time between the arrival of two consecutive pulses of the pulsed radiation beam at the gain medium 624).

Furthermore, the inventor has realized that such an arrangement wherein the gain medium 624 of an optical amplifier 620 is intermittently supplied with pump energy is particularly well suited for use in a supercontinuum radiation source 600. This is because in order to achieve the spectral broadening in the optical medium 630 typically relatively short pulses and small duty cycles are used. In addition, in order to have sufficient power for an alignment mark measurement system, typically a relatively high power pulsed supercontinuum radiation beam $B_{out}$ is desired (for example, having a power of the order of 1-10 W). This is achieved by having an optical amplifier 620 that achieves a high amplification. In turn, this implies that a high level of pump energy is used. The arrangement wherein the gain medium 624 of the optical amplifier 620 is intermittently supplied with pump energy allows the optical amplifier 620 to potentially achieve a high amplification factor whilst still having a relatively long lifetime. In addition, it allows the level of any cooling of the optical amplifier 620 that is provided to be reduced.

The pump power source 626 of the optical amplifier 620 may be configured to supply pump energy to the gain medium 624 for a first time period, the first time period starting before a pulse of the pulsed radiation beam 612 enters the gain medium 624 and finishing after the pulse of the pulsed radiation beam 612 exits the gain medium 624. It will be appreciated that the first time period may start a sufficient period of time before the pulse of the pulsed radiation beam 612 enters the gain medium 624 to allow a population inversion to be achieved in the gain medium 624. It will be further appreciated that said period of time may be dependent on the type of gain medium 624 and the pump energy source 626.

It will be appreciated that for embodiments wherein the pump power source 626 of the optical amplifier 620 supplies pump energy to the gain medium 624 when the pulses of the pulsed radiation beam 612 propagate through the gain medium 624 and does not supply pump energy to the gain medium 624 for at least a portion of the time between the arrival of two consecutive pulses the pump power source 626 may comprise a radiation source operable to produce a pump radiation beam, as described above. Alternatively, it will be appreciated that any other suitable pump power source may be used.

It will be appreciated that some embodiments may combine: (a) a pump radiation beam 628 with a periodic intensity having a frequency that is an integer multiple of the frequency of the pulsed radiation beam 612, and (b) the pump power source 626 of the optical amplifier 620 not supplying pump energy to the gain medium 624 for at least a portion of the time between the arrival of two consecutive pulses the pump power source 626 at the gain medium 624.

In general, the optical amplifier of the supercontinuum radiation source according to embodiments of the invention will comprise a gain medium and a pump power source. In the embodiment shown in FIG. 3, the gain medium 624 of the optical amplifier 620 is provided in an optical fiber and the pump power source 626 comprises a pump radiation source operable to supply a pump radiation beam 628 that propagates along said optical fiber. It will be appreciated that in alternative embodiments, other gain media and pump power sources may alternatively be used. For example, in alternative embodiments the gain medium of the optical amplifier may be provided not in an optical fiber and/or the pump power source may be operable to supply a different form of pump energy to the gain medium.

In general, the supercontinuum radiation source according to embodiments of the invention comprises an optical medium configured to receive the amplified pulsed radiation beam and to broaden a spectrum of that amplified pulsed radiation beam so as to generate a supercontinuum radiation beam. This optical medium may be of any suitable form provided that it has suitable non-linear optical properties to allow for the generation of such a supercontinuum. In some embodiments, this optical medium may comprise one or more waveguides, for example photonic crystal fibers. However, it will be appreciated that in alternative embodiments the optical medium may be not of the form of one or more waveguides.

Further embodiments are disclosed in the subsequent numbered clauses:

1. A supercontinuum radiation source comprising:
   a radiation source operable to produce a pulsed radiation beam;
   an optical amplifier configured to receive the pulsed radiation beam and increase an intensity of the pulsed radiation beam so as to produce an amplified pulsed radiation beam, the optical amplifier comprising a gain medium and a pump power source; and
   an optical medium configured to receive the amplified pulsed radiation beam and to broaden a spectrum of that amplified pulsed radiation beam so as to generate a supercontinuum radiation beam;
   wherein the pump power source of the optical amplifier is configured to supply a pump radiation beam to the gain medium, an intensity of the pump radiation beam being periodic and having a pump frequency and wherein the pump frequency is an integer multiple of the frequency of the pulsed radiation beam.

2. The supercontinuum radiation source of clause 1 wherein the intensity of the pump radiation varies such that the intensity profile of the amplified radiation beam is such that within the optical medium the dominant process that contributes to the generation of the supercontinuum radiation beam is self-phase modulation.

3. The supercontinuum radiation source of clause 1 or 2 wherein the intensity of the pump radiation varies such that the intensity profile of the amplified radiation beam is such that pulse to pulse variations in characteristics of the supercontinuum beam are substantially minimized.

4. The supercontinuum radiation source of any preceding clause wherein the optical amplifier further comprises an adjustment mechanism configured to provide control over the intensity of the pump radiation beam.

5. The supercontinuum radiation source of any preceding clause further comprising a sensor operable to determine one or more characteristics of the supercontinuum beam.

6. The supercontinuum radiation source of clause 5 wherein the sensor is further operable to output a signal indicative of one or more characteristics of the supercontinuum beam.

7. The supercontinuum radiation source of clause 6 when dependent on clause 4 wherein the adjustment mechanism is configured to control the intensity of the pulsed radiation beam in dependence on the signal output by the sensor.

8. A supercontinuum radiation source comprising:
   a radiation source operable to produce a pulsed radiation beam comprising a plurality of pulses;
   an optical amplifier configured to receive the pulsed radiation beam and increase an intensity of the pulsed radiation beam so as to produce an amplified pulsed radiation beam, the optical amplifier comprising a gain medium and a pump power source; and
   an optical medium configured to receive the amplified pulsed radiation beam and to broaden a spectrum of that amplified pulsed radiation beam so as to generate a supercontinuum radiation beam;
   wherein the pump power source of the optical amplifier is configured to supply pump energy to the gain medium when the pulses of the pulsed radiation beam propagate through the gain medium and to not supply pump energy to the gain medium for at least a portion of the time between the arrival of two consecutive pulses of the pulsed radiation beam at the gain medium.

9. The supercontinuum radiation source of clause 8 wherein the pump power source of the optical amplifier is configured to supply pump energy to the gain medium for a first time period, the first time period starting before a pulse of the pulsed radiation beam enters the gain medium finishing after the pulse of the pulsed radiation beam exits the gain medium.

10. The supercontinuum radiation source of any one of clauses 8 or 9 wherein the gain medium of the optical amplifier is provided in an optical fiber along which the pulsed radiation beam can propagate; and wherein the pump power source comprises a pump radiation source operable to supply a pump radiation beam that propagates along said optical fiber.

11. The supercontinuum radiation source of any one of clauses 8 to 10 wherein the pump power source of the optical amplifier is configured to supply a pump radiation beam to the gain medium, an intensity of the pump radiation beam being periodic and having a pump frequency and wherein the pump frequency is an integer multiple of the frequency of the pulsed radiation beam.

12. The supercontinuum radiation source of any preceding clause wherein the radiation source is operable to produce a pulsed radiation beam at a repetition rate of the order of 1 MHz and a pulse duration in the order of 100 ps.

13. The supercontinuum radiation source of any preceding clause wherein the supercontinuum radiation beam has a power of at least 1 W.

14. The supercontinuum radiation source of any preceding clause wherein the supercontinuum radiation beam has a spectrum which comprises radiation in the wavelength range of 400 to 2600 nm.

15. An optical measurement system comprising the supercontinuum radiation source of any preceding clause.

16. An alignment mark measurement system comprising:
   the supercontinuum radiation source of any one of clauses 1 to 14;
   an optical system operable to project the supercontinuum radiation beam onto an alignment mark on a substrate supported on a substrate table;
   a sensor operable to detect radiation diffracted/scattered by the alignment mark and to output a signal containing information related to a position of the alignment mark; and
   a processor configured to receive the signal from the sensor and to determine a position of the alignment mark relative to the substrate table in dependence thereon.

17. A lithographic apparatus comprising the alignment mark measurement system of clause 16.

18. A method for generating a supercontinuum radiation beam, the method comprising:
   producing a pulsed radiation beam;
   passing the pulsed radiation beam through a gain medium of an optical amplifier;
   supplying a pump energy to the gain medium so that as the pulsed radiation beam propagates through the gain medium an intensity of the pulsed radiation beam increases so as to produce an amplified pulsed radiation beam, wherein the pump energy is supplied to the gain medium as a pump radiation beam, an intensity of the pump radiation beam being periodic and having a pump frequency that is an integer multiple of the frequency of the pulsed radiation beam; and passing the amplified pulsed radiation beam through an optical medium configured to broaden a spectrum of that amplified pulsed radiation beam so as to generate a supercontinuum radiation beam.

19. The method of clause 18 wherein the intensity of the pump radiation varies such that the intensity profile of the amplified radiation beam is such that within the optical medium the dominant process that contributes to the generation of the supercontinuum radiation beam is self-phase modulation.

20. The method of clause 18 or 19 wherein the intensity of the pump radiation varies such that the intensity profile of the amplified radiation beam is such that pulse to pulse variations in characteristics of the supercontinuum beam are substantially minimized.

21. The method of any one of clauses 18 to 20, further comprising:

determining one or more characteristics of the supercontinuum beam; and in dependence the one or more determined characteristics of the supercontinuum beam adjusting the intensity of the pulsed radiation beam.

22. A method for generating a supercontinuum radiation beam, the method comprising:

producing a pulsed radiation beam comprising a plurality of pulses;

passing the pulsed radiation beam through a gain medium of an optical amplifier;

supplying a pump energy to the gain medium so that as the pulsed radiation beam propagates through the gain medium an intensity of the pulsed radiation beam increases so as to produce an amplified pulsed radiation beam, wherein pump energy is supplied to the gain medium when the pulses of the pulsed radiation beam propagate through the gain medium and pump energy is not supplied to the gain medium for at least a portion of the time between the arrival of two consecutive pulses of the pulsed radiation beam at the gain medium; and passing the amplified pulsed radiation beam through an optical medium configured to broaden a spectrum of that amplified pulsed radiation beam so as to generate a supercontinuum radiation beam.

23. The method of clause 22 wherein the pump energy is supplied to the gain medium as a pump radiation beam, an intensity of the pump radiation beam being periodic and having a pump frequency and wherein the pump frequency is an integer multiple of the frequency of the pulsed radiation beam.

Although specific reference has been made to the alignment method being used with position measurement apparatus, it is to be understood that the method of measuring asymmetries described herein may also be used to measure overlay between multiple layers of a substrate. For example, the method may be applied when measuring an overlay between coarse and fine features of different layers of a substrate.

Although specific reference may be made in this text to embodiments of the invention in the context of a lithographic apparatus, embodiments of the invention may be used in other apparatus. A radiation source according to embodiments of the present invention may, for example, be used for medical applications, for example as part of a metrology system within a medical device. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

It should be understood that the processing unit PU which controls alignment sensor, processes signals detected by it, and calculates from these signals position measurements suitable for use in controlling the lithographic patterning process, will typically involve a computer assembly of some kind, which will not be described in detail. The computer assembly may be a dedicated computer external to the lithographic apparatus, it may be a processing unit or units dedicated to the alignment sensor or, alternatively, it may be a central control unit LACU controlling the lithographic apparatus as a whole. The computer assembly may be arranged for loading a computer program product comprising computer executable code. This may enable the computer assembly, when the computer program product is downloaded, to control aforementioned uses of a lithographic apparatus with the alignment sensor AS.

In the context of the supercontinuum radiation beam $B_{out}$ output by the supercontinuum radiation source 600 shown in FIG. 3, the terms "radiation" and "beam" may include: infrared radiation (e.g. having a wavelength between 800 nm-2.5 μm) and visible ration (e.g. having a wavelength between 380 nm-800 nm).

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A supercontinuum radiation source comprising:
a radiation source operable to produce a pulsed radiation beam;

an optical amplifier configured to receive the pulsed radiation beam and increase an intensity of the pulsed radiation beam so as to produce an amplified pulsed radiation beam, the optical amplifier comprising a gain medium and a pump power source; and an optical medium configured to receive the amplified pulsed radiation beam and to broaden a spectrum of the amplified pulsed radiation beam so as to generate a supercontinuum radiation beam;

wherein the pump power source of the optical amplifier is configured to supply a pump radiation beam to the gain medium, an intensity of the pump radiation beam being periodic and having a pump frequency, and wherein the pump frequency is an integer multiple of the frequency of the pulsed radiation beam.

2. The supercontinuum radiation source of claim 1, wherein the intensity of the pump radiation varies such that an intensity profile of the amplified radiation beam is such that within the optical medium a dominant process that contributes to the generation of the supercontinuum radiation beam is self-phase modulation.

3. The supercontinuum radiation source of claim 1, wherein the intensity of the pump radiation varies such that an intensity profile of the amplified radiation beam is such that pulse to pulse variations in characteristics of the supercontinuum beam are substantially minimized.

4. The supercontinuum radiation source of claim 1, wherein the optical amplifier further comprises an adjustment mechanism configured to provide control over the intensity of the pump radiation beam.

5. The supercontinuum radiation source of claim 1, further comprising a sensor operable to determine one or more characteristics of the supercontinuum beam.

6. The supercontinuum radiation source of claim 5, wherein the sensor is further operable to output a signal indicative of one or more characteristics of the supercontinuum beam.

7. The supercontinuum radiation source of claim 5, wherein the optical amplifier further comprises an adjustment mechanism that is configured to control the intensity of the pulsed radiation beam in dependence on the signal output by the sensor.

8. An optical measurement system comprising the supercontinuum radiation source of claim 1.

9. An alignment mark measurement system comprising:
a supercontinuum radiation source comprising:
    a radiation source operable to produce a pulsed radiation beam;
    an optical amplifier configured to receive the pulsed radiation beam and increase an intensity of the pulsed radiation beam so as to produce an amplified pulsed radiation beam, the optical amplifier comprising a gain medium and a pump power source; and
    an optical medium configured to receive the amplified pulsed radiation beam and to broaden a spectrum of the amplified pulsed radiation beam so as to generate a supercontinuum radiation beam;
    wherein the pump power source of the optical amplifier is configured to supply a pump radiation beam to the gain medium, an intensity of the pump radiation beam being periodic and having a pump frequency, and
    wherein the pump frequency is an integer multiple of the frequency of the pulsed radiation beam;
an optical system operable to project the supercontinuum radiation beam onto an alignment mark on a substrate supported on a substrate table;
a sensor operable to detect radiation diffracted/scattered by the alignment mark and to output a signal containing information related to a position of the alignment mark; and
a processor configured to receive the signal from the sensor and to determine a position of the alignment mark relative to the substrate table in dependence thereon.

10. A lithographic apparatus comprising the alignment mark measurement system of claim 9.

11. A method for generating a supercontinuum radiation beam, the method comprising:
producing a pulsed radiation beam;
passing the pulsed radiation beam through a gain medium of an optical amplifier;
supplying a pump energy to the gain medium so that as the pulsed radiation beam propagates through the gain medium an intensity of the pulsed radiation beam increases so as to produce an amplified pulsed radiation beam, wherein the pump energy is supplied to the gain medium as a pump radiation beam, an intensity of the pump radiation beam being periodic and having a pump frequency that is an integer multiple of the frequency of the pulsed radiation beam; and
passing the amplified pulsed radiation beam through an optical medium configured to broaden a spectrum of that amplified pulsed radiation beam so as to generate a supercontinuum radiation beam.

12. The method of claim 11, further comprising:
determining one or more characteristics of the supercontinuum beam; and
in dependence the one or more determined characteristics of the supercontinuum beam, adjusting the intensity of the pulsed radiation beam.

* * * * *